United States Patent
Kawamoto et al.

[11] Patent Number: 6,062,852
[45] Date of Patent: May 16, 2000

[54] SUBSTRATE HEAT-TREATING APPARATUS

[75] Inventors: Takanori Kawamoto; Masami Ohtani; Yasuo Imanishi; Masao Tsuji; Masaki Iwami; Joichi Nishimura; Akihiko Morita, all of Kyoto, Japan

[73] Assignee: Dainippon Screen Mfg. Co., Ltd., Japan

[21] Appl. No.: 09/060,422

[22] Filed: Apr. 14, 1998

[30] Foreign Application Priority Data

Apr. 22, 1997 [JP] Japan ................................. 9-120174

[51] Int. Cl.[7] .................................................. F27D 5/00
[52] U.S. Cl. ...................... 432/258; 432/253; 432/259; 392/418
[58] Field of Search .................................. 432/258, 259, 432/253; 392/418, 416; 118/728, 500; 219/405, 411, 390; 211/41.18, 41.1; 269/903

[56] References Cited

U.S. PATENT DOCUMENTS

| | | | |
|---|---|---|---|
| 4,591,044 | 5/1986 | Ogami et al. .......................... 198/346.3 |
| 4,919,614 | 4/1990 | Kitagawa et al. ....................... 432/259 |
| 5,156,820 | 10/1992 | Wong et al. ............................. 392/418 |
| 5,192,371 | 3/1993 | Shuto et al. ............................. 118/728 |
| 5,310,339 | 5/1994 | Ushikawa ................................ 432/253 |
| 5,595,604 | 1/1997 | Kobayashi et al. ..................... 118/728 |
| 5,716,207 | 2/1998 | Mishina et al. ......................... 432/253 |
| 5,762,745 | 6/1998 | Hirose .................................... 432/253 |

FOREIGN PATENT DOCUMENTS 4-56146  2/1992  Japan .

Primary Examiner—John A. Jeffery
Assistant Examiner—Jiping Lu
Attorney, Agent, or Firm—Ostrolenk, Faber, Gerb & Soffen, LLP

[57] ABSTRACT

A substrate heat-treating apparatus includes a heat-treating plate, and support pins extending through the heat-treating plate to be vertically movable relative thereto. The support pins support each substrate at a lower surface thereof such that edges of the substrate are at a higher level than a central region of the substrate. This construction facilitates air flows into and out of a space between the lower surface of the substrate and the upper surface of the heat-treating plate when the substrate is vertically moved.

9 Claims, 9 Drawing Sheets

SUBSTRATE HEAT-TREATING APPARATUS

BACKGROUND OF THE INVENTION

1. Field of the Invention

The present invention relates to a heat-treating apparatus for heat-treating, i.e. heating or cooling, substrates such as substantially circular semiconductor wafers.

2. Description of the Related Art

A substrate treating apparatus for effecting chemical treatment of substrates, such as resist application to or development of the substrates, performs heat treatment of the substrates as well. That is, the substrates are heated by a heating apparatus before and after the chemical treatment, and the heated substrates are cooled to room temperature by a cooling apparatus.

The heat-treating apparatus, i.e. the heating apparatus or cooling apparatus, for performing such heat treatment includes a heat-treating plate which may be a heating plate containing a heating device such as heaters, or a cooling plate containing a cooling device such as Peltier elements. The heat-treating apparatus heats or cools each substrate placed on the upper surface of the heat-treating plate.

The heat-treating apparatus described in U.S. Pat. No. 4,919,614, for example, includes three balls arranged on a heat-treating plate to protrude slightly from the upper surface thereof. A substrate is supported by the balls such that a minute spacing, called a proximity gap, is formed over the heat-treating plate between the upper surface of the heat-treating plate and the lower surface of the substrate. In this state, the substrate is heated or cooled.

Such heat-treating apparatus has support pins vertically movably extending through perforations formed in the heat-treating plate. In order to allow a substrate transported by a transport arm of a substrate transport mechanism to be placed on the heat-treating plate, the support pins are raised to position the upper, distal ends the support pins above the surface of the heat-treating plate. Then, the transport arm deposits the substrate on the support pins. Subsequently, the support pins are lowered to the substrate on the heat-treating plate. For transferring the substrate to the transport arm after heat treatment of the substrate on the heat-treating plate, has been completed the substrate support pins are raised to push the substrate up from the heat-treating plate. The substrate, in a raised position, is transferred to the transport arm.

The above heat-treating apparatus gives rise to a problem that the substrate may be placed horizontally immediately before the substrate is placed on the heat-treating plate or immediately after the substrate is raised from the heat-treating plate.

That is, when the support pins supporting the substrate are quickly lowered, the substrate is borne by air present between the lower surface of the substrate and the upper surface of the heat-treating plate since the two opposed surfaces are planar. The substrate may shift horizontally out of place under this supporting action of air. Such a phenomenon is amplified when the heated substrate is placed on a cooling plate. In this case, the substrate heats and expands the air between the lower surface of the substrate supported by the support pins and the upper surface of the cooling plate.

When the support pins are driven to raise the substrate having undergone heat treatment on the heat-treating plate, air does not flow smoothly into a space between the lower surface of the substrate and the upper surface of the heat-treating plate since the two opposed surfaces are planar. Consequently, the substrate supported by the support pins is subjected to a downwardly acting stress upon start of the ascent. As the substrate is raised in this state, a large quantity of air rapidly flows into the space between the lower surface of the substrate and the upper surface of the heat-treating plate. This cancels the stress applied to the substrate, and a reaction acts to lift the substrate above the support pins. As a result, the substrate may shift horizontally out of place.

Japanese Patent Publication (Unexamined) H4-56146 discloses a substrate treating apparatus having guide pins erected on a heat-treating plate for restricting a horizontal displacement of a substrate thereon.

However, the following problem is encountered where, as in the apparatus described in the above publication, guide pins are erected on a heat-treating plate. With short guide pins, a substrate may become misaligned in a position displaced from the guide pins. With tall guide pins, on the other hand, the apparatus must have a large construction to avoid the guide pins obstructing substrate transport. The tall guide pins have a further disadvantage of rubbing against edges of the substrate when the latter is raised or lowered, thereby producing particles.

SUMMARY OF THE INVENTION

The object of the invention, therefore, is to provide a substrate heat-treating apparatus for effectively preventing a displacement of a substrate when the substrate is raised and lowered as supported by a supporting device.

The above object is fulfilled, according to the present invention, by a substrate heat-treating apparatus comprising a heat-treating plate for heat-treating a substrate placed thereon, a supporting device for supporting the substrate at peripheries thereof from below such that at least part of edges of the substrate are at a higher level than a central region of the substrate, and a lift device for raising and lowering the supporting device relative to the heat-treating plate.

According to the above substrate heat-treating apparatus, the supporting device supports the substrate at peripheries thereof from below such that the at least part of edges of the substrate are at a higher level than the central region of the substrate. This construction facilitates air flows into and out of a space between the lower surface of the substrate and the upper surface of the heat-treating plate when the substrate is vertically moved. Consequently, the substrate is prevented from shifting horizontally out of place.

In a preferred embodiment, the heat-treating plate includes balls embedded with upper ends thereof slightly protruding from the surface of the heat-treating plate, the substrate being placed on the balls.

In another preferred embodiment, the supporting device has support portions for supporting, from below, the substrate in peripheral positions at a predetermined distance from the edges thereof.

Preferably, the supporting device includes a plurality of support pins extending through the heat-treating plate to be vertically movable by the lift device relative to the heat-treating plate.

The substrate may be a substantially circular semiconductor wafer, and the supporting device may include three support pins for supporting a lower surface of the semiconductor wafer in positions at a distance of at most ⅓ of a radius of the semiconductor wafer from edges of the semiconductor wafer.

In a further preferred embodiment, the supporting device has support portions for supporting, from below, the substrate in peripheral positions adjacent the edges thereof, and position restricting portions for restricting a horizontal position of the substrate by contacting the edges of the substrate.

In this case, the supporting device, preferably, includes a plurality of support pins extending through the heat-treating plate to be vertically movable by the lift device relative to the heat-treating plate.

In a different aspect of the present invention, a heat-treating apparatus for heat-treating substantially circular semiconductor wafers comprises a heat-treating plate for heat-treating a semiconductor wafer placed thereon, a plurality of support pins extending through the heat-treating plate for supporting the semiconductor wafer placed on the heat-treating plate, at peripheries thereof from below by contacting a lower surface of the semiconductor wafer in positions at a distance of at least ⅔ of a radius of the semiconductor wafer from a center of the semiconductor wafer, such that at least part of edges of the semiconductor wafer are at a higher level than a central region of the semiconductor wafer, and a lift device for raising and lowering the support pins relative to the heat-treating plate.

In a further aspect of the present invention, a heat-treating apparatus for heat-treating substantially circular semiconductor wafers comprises a heat-treating plate for heat-treating a semiconductor wafer placed thereon, three support pins extending through the heat-treating plate for supporting the semiconductor wafer placed on the heat-treating plate, at peripheries thereof from below by contacting a lower surface of the semiconductor wafer in positions at a distance of at least ⅔ of a radius of the semiconductor wafer from a center of the semiconductor wafer, such that at least part of edges of the semiconductor wafer are at a higher level than a central region of the semiconductor wafer, a support arm for supporting the three support pins, and a lift device for raising and lowering the three support pins relative to the heat-treating plate by raising and lowering the support arm relative to the heat-treating plate.

Other features and advantages of the present invention will be apparent from the following detailed description of the embodiments of the invention.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Embodiments of the present invention will be described hereinafter with reference to the drawings.

Figure 1:
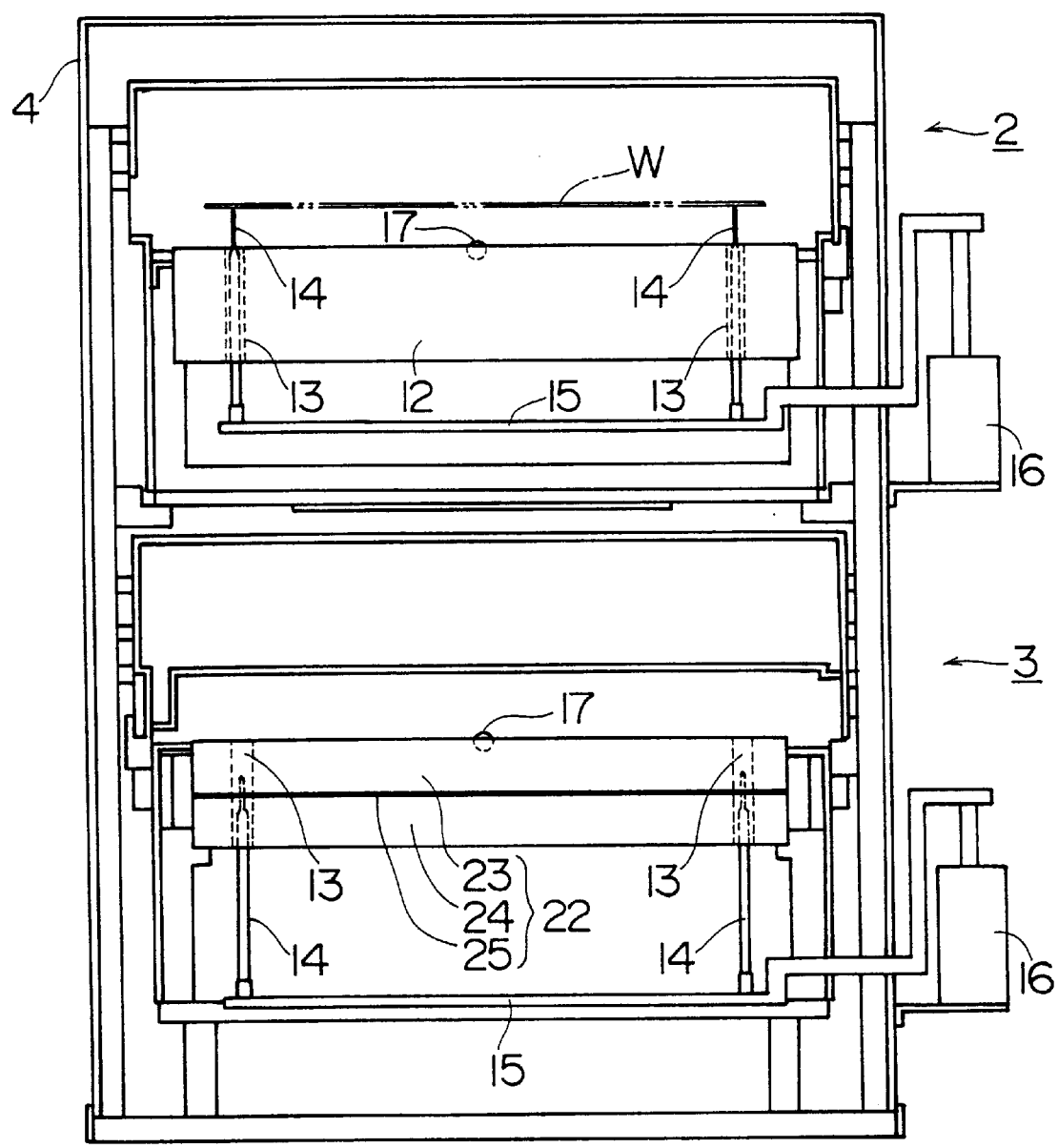
FIG. 1 is a view in vertical section of a heat-treating apparatus in a first embodiment of the present invention.
Figure 2:
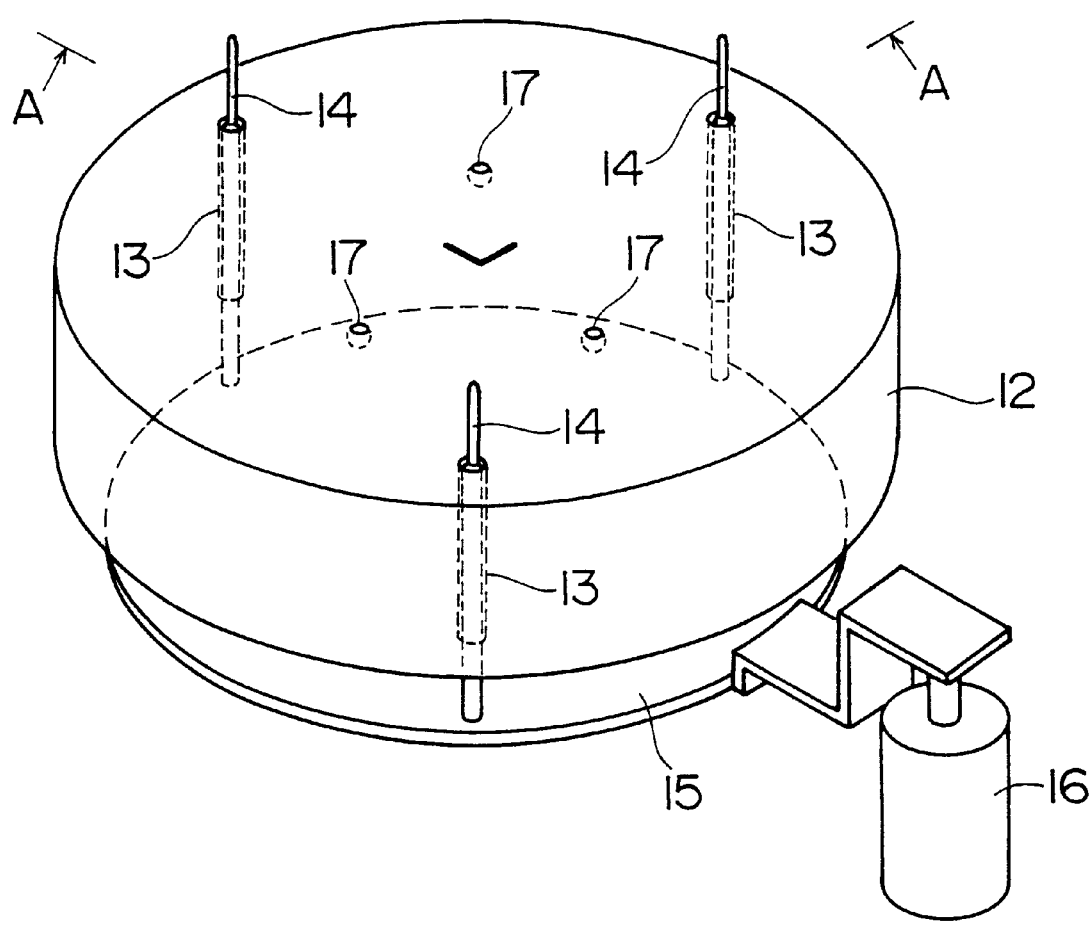
FIG. 2 is a perspective view of a principal portion of a heating unit shown in FIG. 1.

FIG. 1 is a view in vertical section of a heat-treating apparatus in a first embodiment of the present invention. FIG. 2 is a perspective view of a principal portion of a heating unit 2. FIG. 1 represents section A—A in FIG. 2.

This heat-treating apparatus includes the heating unit 2 and a cooling unit 3 enclosed in a housing 4, each unit acting as a heat-treating device. The heat-treating apparatus carries out heating treatment and cooling treatment of a substantially circular semiconductor wafer W which is one example of substrates.

The heating unit 2 includes a heating plate 12 acting as a heat-treating plate. The heating plate 12 contains a plate-like heater acting as a heating device. The heating plate 12 defines three perforations 13. Three support pins 14 constituting a supporting device vertically movably extend through the perforations 13.

These three support pins 14 are formed of a heatproof insulating material such as fluororesin, ceramics or polyimide resin. The three support pins 14 are erected on a support arm 15, in positions opposed to peripheral positions on the lower surface of wafer W supported by the support pins 14. The support arm 15 is connected to an air cylinder 16 acting as a lift device. Thus, the air cylinder 16 is driven to raise the support pins 14 to a wafer transfer position with upper ends thereof projecting from the upper surface of heating plate 12, and to lower the support pins 14 to a wafer heating position with the upper ends thereof retracted into the perforations 13 of the heating plate 12.

Figure 3:
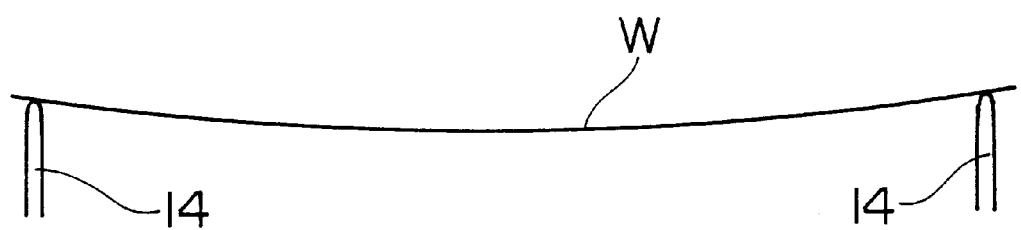
FIG. 3 is a schematic view of a substrate supported at peripheries thereof by support pins.
Figure 4:
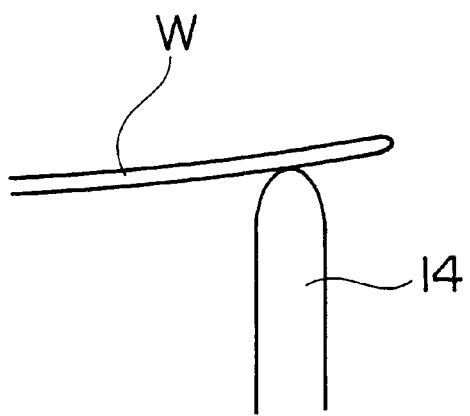
FIG. 4 is an enlarged fragmentary view of FIG. 3

FIG. 3 is a schematic view showing the wafer W supported at peripheries thereof by the support pins 14. FIG. 4 is an enlarged fragmentary view thereof. FIG. 3 also represents section A—A in FIG. 2.

As shown in these figures, the wafer W supported at peripheries thereof sags under its own weight, with edges at a higher level than a central region thereof. This phenomenon is outstanding where the wafer W is a semiconductor wafer approximately 300 mm (12 inches) or more in diameter.

As shown in FIG. 2, three balls 17 are embedded in the surface of heating plate 12. These balls 17 are formed of a low heat conduction material such as alumina. The balls 17 are embedded with upper ends thereof slightly protruding from the surface of heating plate 12. Thus, the wafer W is heated as placed on and supported by the balls 17 of heating plate 12 such that a minute spacing called a proximity gap is formed between the lower surface of wafer W and the upper surface of heating plate 12.

On the other hand, the cooling unit 3 includes a cooling plate 22 acting as a heat-treating plate. As shown in FIG. 1, the cooling plate 22 is formed of a heat conducting plate 23, a water-cooled plate 24, and Peltier elements 25 arranged between the heat conducting plate 23 and water-cooled plate 24. The water-cooled plate 24 and Peltier elements 25 constitute a cooling device. The cooling plate 22 defines three perforations 13 as does the heating plate 12. Three support pins 14 constituting a supporting device vertically movably extend through the perforations 13.

The three support pins 14 are erected on a support arm 15, in positions opposed to peripheral positions on the lower surface of wafer W supported by the support pins 14. The support arm 15 is connected to an air cylinder 16 acting as a lift device. Thus, the air cylinder 16 is driven to raise the support pins 14 to a wafer transfer position with upper ends thereof projecting from the surface of cooling plate 22, and to lower the support pins 15 to a wafer cooling position with the upper ends thereof retracted into the perforations 13 of the cooling plate 22.

In the cooling unit 3 also, as shown in FIGS. 3 and 4, the wafer W supported at peripheries thereof sags under its own weight, with the edges at a higher level than the central region thereof.

As in the case of heating plate 12 shown in FIG. 2, three balls 17 are embedded in the surface of cooling plate 22. These balls 17 are formed of a low heat conduction material such as alumina. The balls 17 are embedded with upper ends thereof slightly protruding from the surface of cooling plate 22. Thus, the wafer W is cooled as placed on and supported by the balls 17 of cooling plate 22 such that a minute spacing called a proximity gap is formed between the lower surface of wafer W and the upper surface of cooling plate 22.

The above heat-treating apparatus includes the heating unit 2 having the heating plate 12 containing a heater, and the cooling unit 3 having the cooling plate 22 formed of the heat conducting plate 23, water-cooled plate 24, and Peltier elements 25. However, the heat-treating apparatus may include a single heat-treating plate in the form of a heat conducting plate, and a heating device and a cooling device attachable to and detachable from (i.e. placeable in contact with and separable from) the heat conducting plate. Thus, the wafer W may be heated and cooled by the single heat-treating plate.

Operations to load and unload the wafer W on/from the heating plate 12 of heating unit 2 and the cooling plate 22 of cooling unit 3 will be described next. The wafer loading and unloading operations are the same for the heating plate 12 and the cooling plate 22. Therefore, only the wafer loading and unloading operations for the heating plate 12 will be described hereinafter.

Preparatory to loading the wafer W on the heating plate 12, the air cylinder 16 is driven to raise the support pins 14 to the wafer transfer position. Then, the wafer W is deposited on the support pins 14. The air cylinder 16 is driven to lower the support pins 14 to the heating position (to the cooling position in the case of cooling unit 3).

At this time, as noted hereinbefore, the wafer W supported at peripheries thereof sags under its own weight, with the edges at a higher level than the central region thereof. Thus, even when the support pins 14 are lowered fast, air present between the lower surface of wafer W supported by the support pins 14 and the upper surface of heating plate 12 flows quickly along the lower surface of wafer W and out from under the wafer W. As a result, the wafer W in descent never shifts horizontally out of place.

Upon completion of heating treatment of the wafer W resting on the balls 17 of heating plate 12, the support pins 14 are raised to the wafer transfer position, separating the wafer W from the heating plate 12. At this time, the peripheries of wafer W are first raised by the support pins 14, and then the wafer W as a whole ascends as sagging under its own weight. Consequently, air flows easily into a space between the lower surface of wafer W and the upper surface of heating plate 12. There is no possibility of the wafer W bouncing to shift horizontally on the support pins 14.

After the wafer W is raised from the heating plate 12, the wafer W is unloaded from the support pins 14.

With the heat-treating apparatus in the first embodiment, as described above, the support pins 14 support the wafer W at peripheries thereof in such a way that edges of wafer W are at a higher level than the central region thereof. This support mode facilitates air flows into and out of the space between the lower surface of wafer W and the upper surface of heating plate 12 or cooling plate 22 acting as a heat-treating plate. The wafer W is thereby prevented from becoming horizontally displaced.

Figure 5:
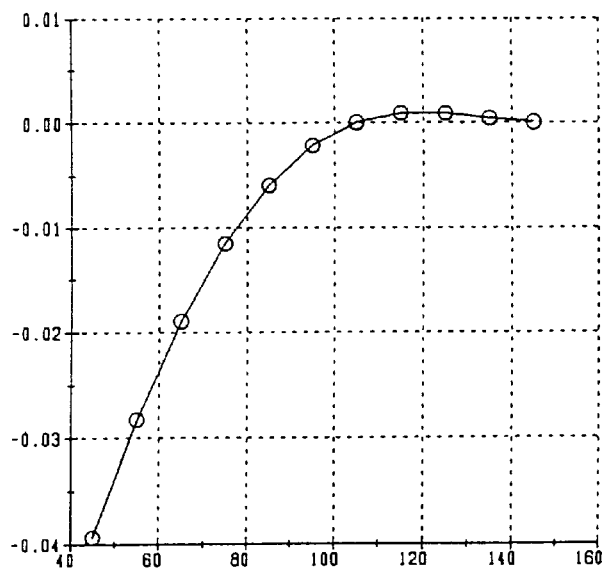
FIG. 5 is a graph showing heights of the lower surface of the substrate relative to the upper ends of three support pins in an equidistant arrangement.
Figure 6:
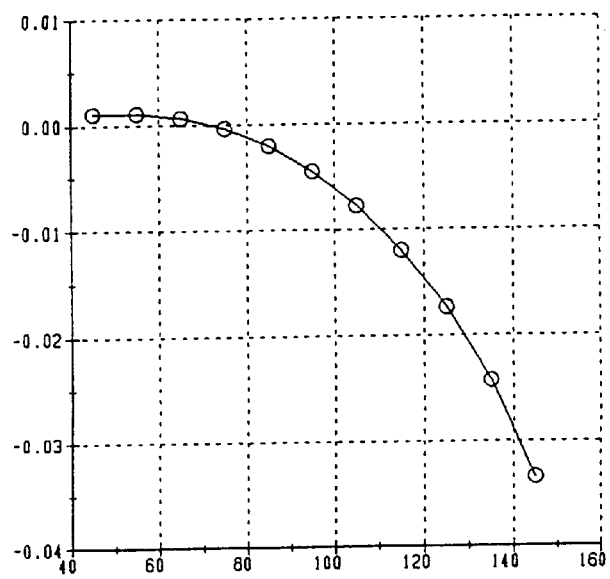
FIG. 6 is a graph showing heights of the lower surface of the substrate relative to the upper ends of the three support pins in the equidistant arrangement.

FIGS. 5 and 6 are graphs showing heights of the lower surface of wafer W relative to the upper ends of support pins 14 where the wafer W is a semiconductor wafer approximately 300 mm (12 inches) in diameter, and is supported by three support pins 14 in an equidistant arrangement. FIG. 5 shows heights of edges of wafer W closest to the positions supported by the support pins 14. FIG. 6 shows heights of the central region of wafer W. In each of these figures, the vertical axis represents the heights (mm) of the lower surface of wafer W relative to the upper ends of support pins 14, while the horizontal axis represents distances (mm) from the center of wafer W to the positions supported by the support pins 14.

As seen from FIGS. 5 and 6, when the distance from the center of wafer W to the positions supported by the support pins 14 is approximately 90 mm, the center of wafer W and the edges closest to the positions supported by the support pins 14 are at approximately the same height. When the distance from the center of wafer W to the positions supported by the support pins 14 is approximately 100 mm or greater (i.e. $\frac{2}{3}$ of the radius of wafer W or greater), the edges closest to the positions supported by the support pins 14 are higher than the center of wafer W.

Thus, where the wafer W is a substantially circular semiconductor wafer and is supported by three support pins 14, the support pins 14 should support the wafer W in positions at a distance of at least $\frac{2}{3}$ of the radius of wafer W from the center of wafer W.

In the above case, it will serve the purpose only if the edges closest to the positions supported by the support pins 14 are higher than the center of wafer W. That is, part of the edges of wafer W may be lower than the center of wafer W.

Figure 7:
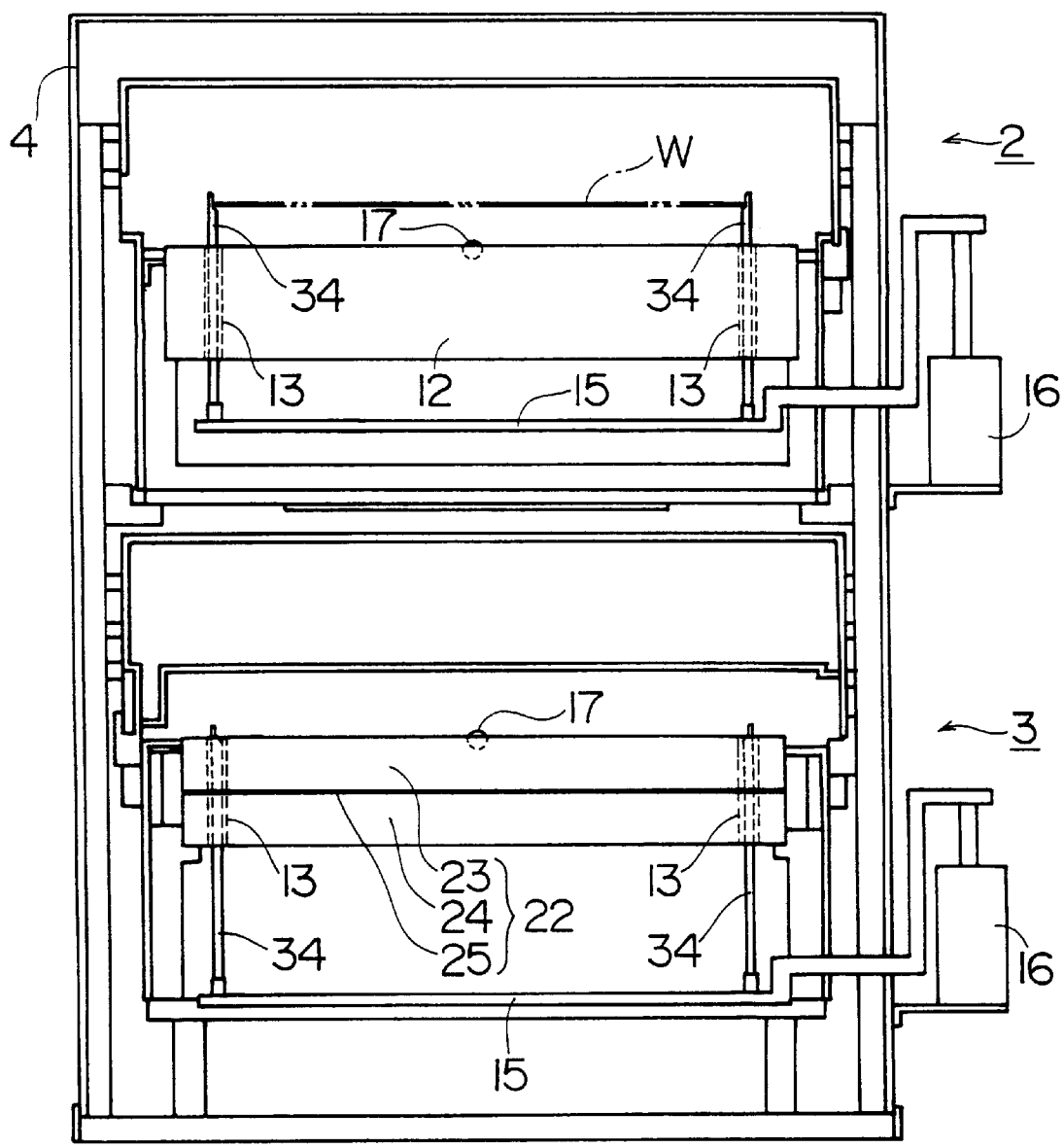
FIG. 7 is a view in vertical section of a heat-treating apparatus in a second embodiment of the present invention.
Figure 8:
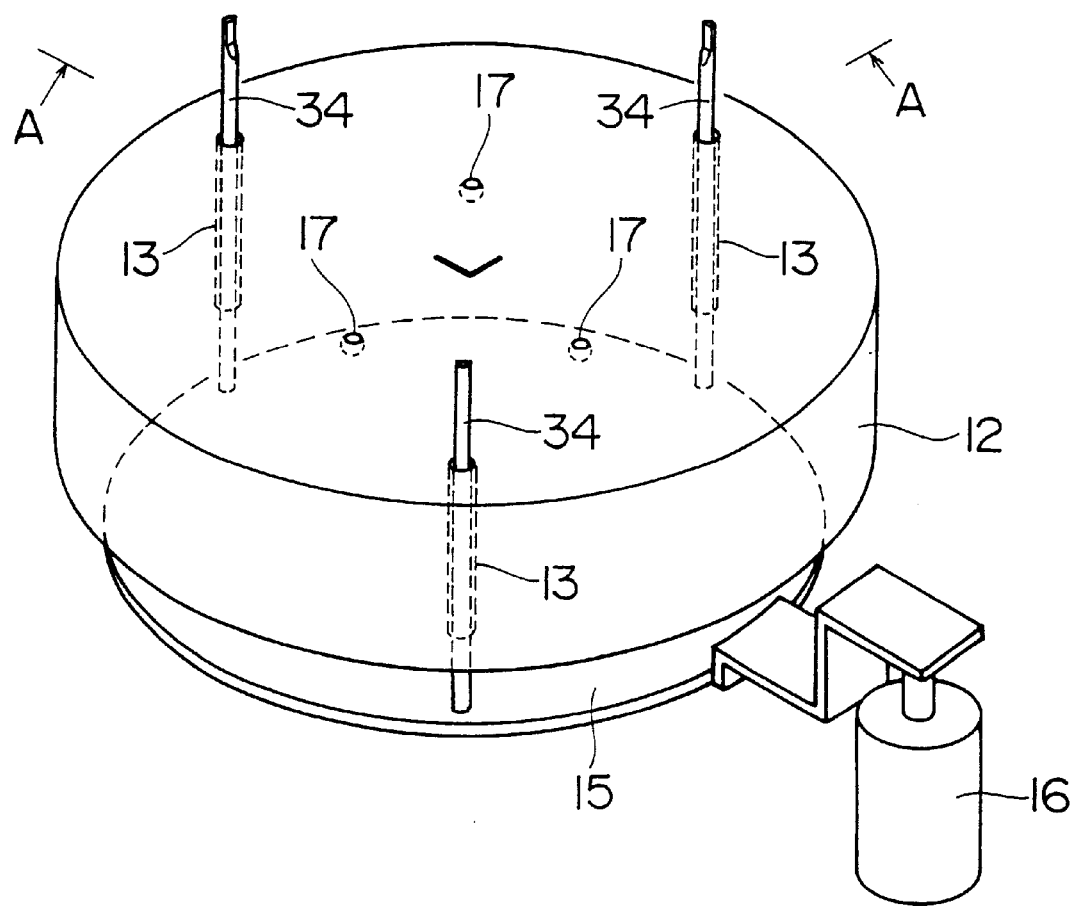
FIG. 8 is a perspective view of a principal portion of the heating unit shown in FIG. 7.
Figure 9:
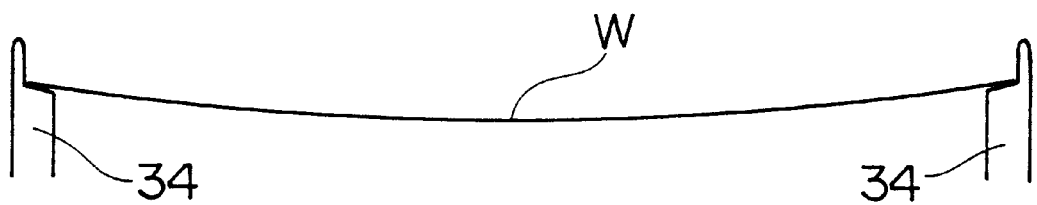
FIG. 9 is a schematic view of a substrate supported at peripheries thereof by support pins in the second embodiment.
Figure 10:
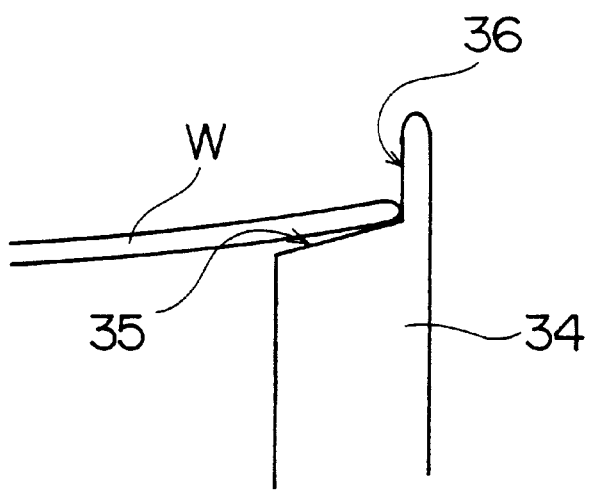
FIG. 10 is an enlarged fragmentary view of FIG. 9.

Another embodiment of the present invention will be described hereinafter. FIG. 7 is a view in vertical section of a heat-treating apparatus in a second embodiment of the present invention. FIG. 8 is a perspective view of a principal portion of a heating unit 2. FIG. 7 represents section A—A in FIG. 8. FIG. 9 is a schematic view showing a wafer W supported at peripheries thereof by support pins 34. FIG. 10 is an enlarged fragmentary view thereof. FIG. 9 also represents section A—A in FIG. 8. In these figures, like reference numerals are used to identify like parts in the first embodiment shown in FIGS. 1 and 2, and will not be described again.

The heat-treating apparatus in the second embodiment employs support pins 34 as shown in FIG. 10, in place of the support pins 14 of the heat-treating apparatus in the first embodiment. Each support pin 34 includes a support portion 35 in the form of a slope for supporting a periphery of wafer W from below, and a position restricting portion 36 in the form of a vertical restricting surface for contacting an edge of wafer W to restrict a horizontal position of wafer W. The support pins 34 are formed of a heatproof insulating material such as fluororesin, ceramics or polyimide resin, as are the support pins 14 in the first embodiment.

Operations to load and unload the wafer W on/from the heating plate 12 of heating unit 2 and the cooling plate 22 of cooling unit 3 in the second embodiment will be described next. Again, the wafer loading and unloading operations are the same for the heating plate 12 and the cooling plate 22. Only the wafer loading and unloading operations for the heating plate 12 will be described hereinafter.

Preparatory to loading the wafer W on the heating plate 12, the air cylinder 16 is driven to raise the support pins 34 to the wafer transfer position. Then, the wafer W is placed on the support pins 34. The air cylinder 16 is driven to lower the support pins 34 to the heating position (to the cooling position in the case of cooling unit 3).

At this time, as in the first embodiment, the wafer W supported at peripheries thereof sags under its own weight, with the edges at a higher level than the central region thereof. Thus, even when the support pins 34 are lowered fast, air present between the lower surface of wafer W supported by the support pins 34 and the upper surface of heating plate 12 flows quickly along the lower surface of wafer W and out from under the wafer W. In the second embodiment, the edges of wafer W are in contact with the position restricting portions 36 which restrict the horizontal position of wafer W. Consequently, the wafer W in descent never becomes horizontally displaced.

As shown in FIG. 7, when the support pins 34 are lowered to the heating position, the position restricting portions 36 at the distal ends of support pins 34 remain projecting upward from the upper surface of heating plate 12 to restrict the horizontal position of wafer W placed on the balls 17 of heating plate 12.

Upon completion of heating treatment of the wafer W resting on the balls 17 of heating plate 12, the support pins 34 are raised to the wafer transfer position to separate the wafer W from the heating plate 12. At this time, the peripheries of wafer W are first raised by the support pins 34, and then the wafer W as a whole ascends as sagging under its own weight. Consequently, air flows easily into the space between the lower surface of wafer W and the upper surface of heating plate 12. The wafer W is retained in the fixed horizontal position by the position restricting portions 36 contacting the edges of wafer W. Thus, the wafer W in ascent never becomes horizontally displaced.

After the wafer W is raised from the heating plate 12, the wafer W is unloaded from the support pins 34.

With the heat-treating apparatus in the second embodiment, as described above, the support pins 34 support the wafer W at peripheries thereof in such a way that the edges of wafer W are at a higher level than the central region thereof. This support mode facilitates air flows into and out of the space between the lower surface of wafer W and the upper surface of heating plate 12 or cooling plate 22 acting as a heat-treating plate. Further, the wafer W is retained in the fixed horizontal position by the position restricting portions 36 contacting the edges of wafer W. This ensures that the wafer W is prevented from shifting horizontally out of place.

Figure 11:
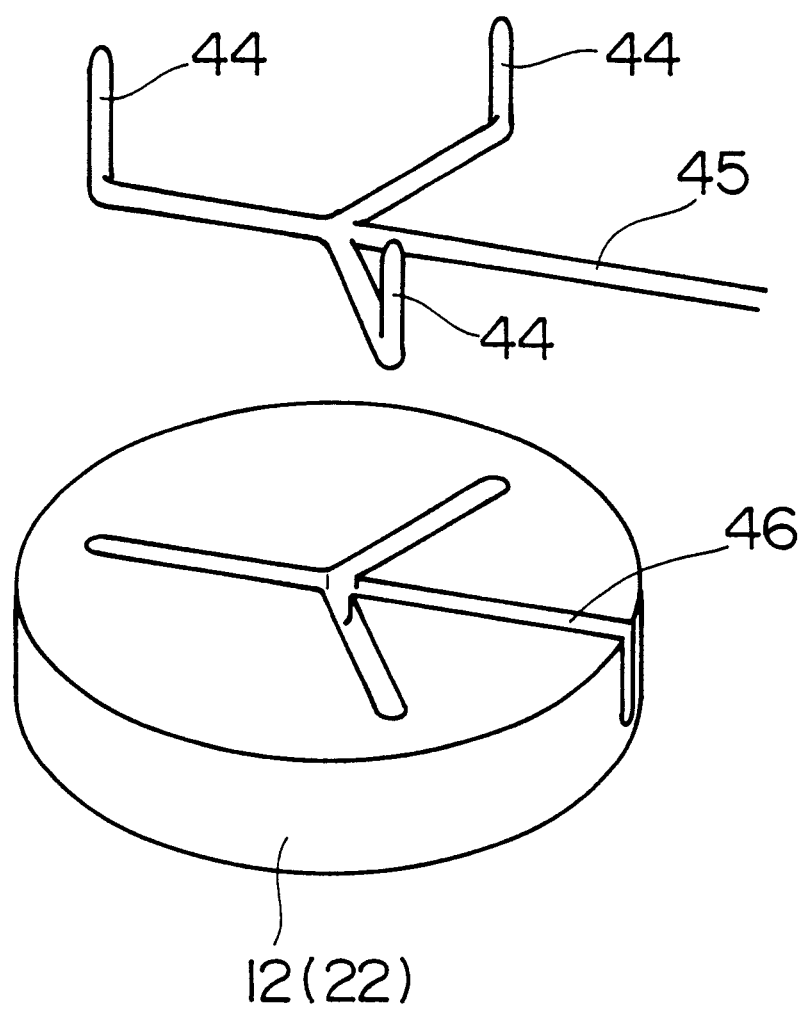
FIG. 11 is a perspective view of a principal portion of a heat-treating apparatus in a third embodiment of the present invention.

A further embodiment of the present invention will be described next. FIG. 11 is a perspective view of a principal portion of a heat-treating apparatus in a third embodiment of the present invention.

The first and second embodiment described hereinbefore employ support pins 14 and 34 extending through the perforations 13 formed in the heating plate 12 or cooling plate 22. In the third embodiment, three support pins 44 connected to a support 45 are arranged in grooves 46 formed in the heating plate 12 (or cooling plate 22). The support 45 is connected to an air cylinder similar to the air cylinder 16 described hereinbefore. The support pins 44 support the wafer W at peripheries thereof as in the first and second embodiments.

With the heat-treating apparatus in this embodiment, when placing the wafer W on the heating plate 12 (or cooling plate 22), or when separating the wafer W upward from the heating plate 12 (or cooling plate 22), the grooves 46 containing the support pins 44 and support 45 act as an air passage. This construction assures an efficient release of air from the space between the lower surface of wafer W supported by the support pins 44 and the upper surface of heating plate 12 (or cooling plate 22) when the support pins 44 are lowered, and an efficient inflow of air to the same space when the wafer W is separated from the heating plate 12 (or cooling plate 22). Consequently, the wafer W is prevented, with increased reliability, from shifting horizontally out of place.

Figure 12:
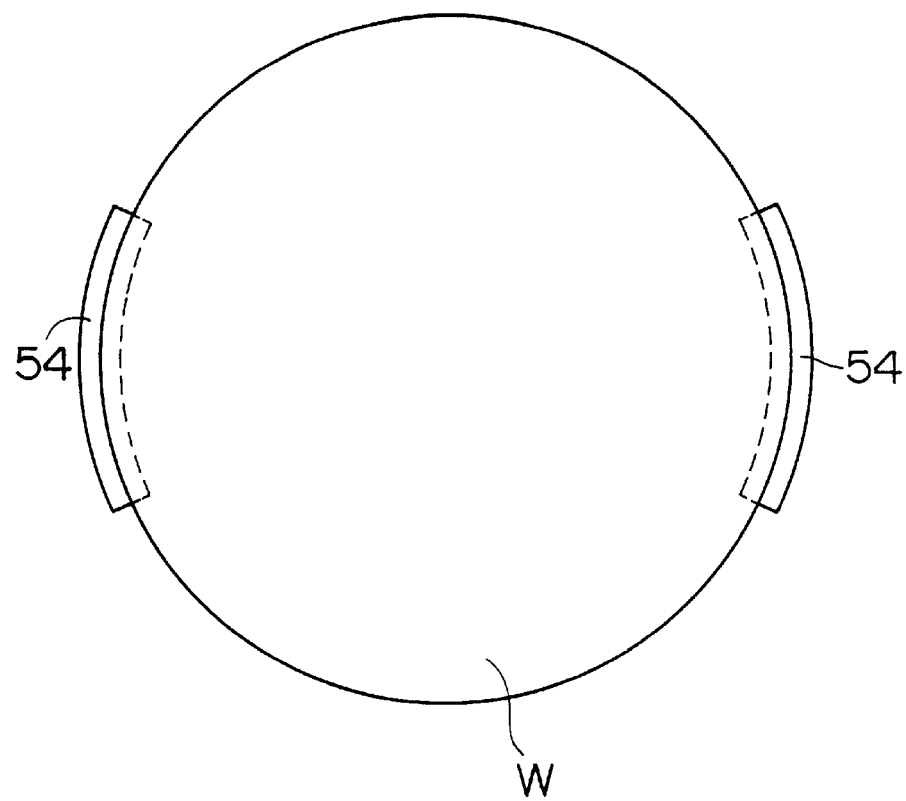
FIG. 12 is a plan view of a substrate supported at peripheries thereof by support members.
Figure 13:
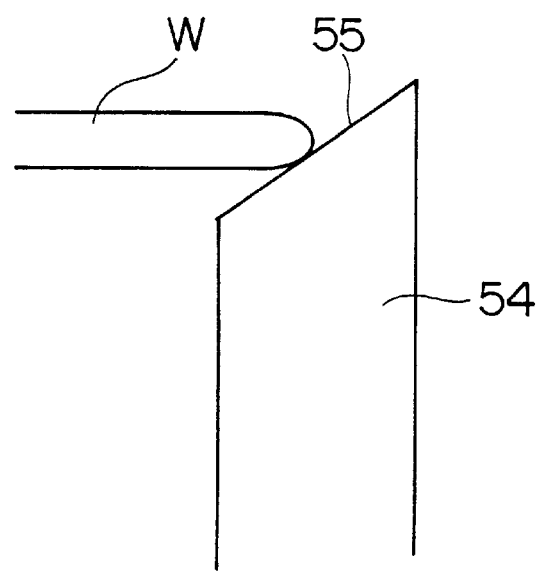
FIG. 13 is an enlarged fragmentary view of FIG. 12.

The first, second and third embodiments described above employ support pins 14, 34 or 44 as a supporting device for supporting the wafer W. However, the supporting device may be shaped otherwise than pin-shaped. FIG. 12 is a plan view showing support members 54 acting as such a supporting device for supporting the wafer W at peripheries thereof FIG. 13 is an enlarged view of a principal portion of one of the support members 54.

Each support member 54 has a slope 55 extending along an edge of wafer W. This support member 54 supports the edge of wafer W with the slope 55 contacting the edge of wafer W. This construction is effective to prevent the wafer W from shifting out of place as are the first, second and third embodiments described hereinbefore.

In the foregoing embodiments, the support pins 14, 34 or 44 or support members 54 are vertically movable relative to the heating plate 12 or cooling plate 22. It is also possible to adapt the heating plate 12 or cooling plate 22 to be vertically movable relative to the support pins 14, 34 or 44 or support members 54.

The present invention may be embodied in other specific forms without departing from the spirit or essential attributes thereof and, accordingly, reference should be made to the appended claims, rather than to the foregoing specification, as indicating the scope of the invention.

This application claims priority benefit under 35 U.S.C. Section 119 of Japanese Patent Application No. 9-120174 filed in the Japanese Patent Office on Apr. 22, 1997, the entire disclosure of which is incorporated herein by reference.

What is claimed is:

1. A substrate heat-treating apparatus, comprising:
    a heat-treating plate for heat-treating a substrate placed thereon;
    support means for supporting said substrate in a generally horizontal position, said support means including a plurality of vertical support portions for supporting said substrate along the bottom thereof and a plurality of horizontal support portions for supporting a peripheral edge of said substrate to prevent horizontal movement of said substrate;
    a lift for raising and lowering said support means and with it said substrate relative to said heat-treating plate, said lift raising and lowering said support means in such a manner that said horizontal support portions extend above an upper surface of said substrate during the entire time that said substrate is lowered relative to said heat-treating plate.

2. A substrate heat-treating apparatus as defined in claim 1, wherein said heat-treating plate includes balls embedded with upper ends thereof slightly protruding from the surface of said heat-treating plate, said substrate being placed on said balls.

3. A substrate heat-treating apparatus as defined in claim 1, wherein said support means includes a plurality of support pins extending through said heat-treating plate to be vertically movable by said lift relative to said heat-treating plate.

4. A substrate heat-treating apparatus as defined in claim 1, wherein said lift raises and lowers said support means in such a manner that said horizontal support portions extend above said upper surface of said substrate during the entire time that said substrate is raised and lowered.

5. A substrate heat-treating apparatus as defined in claim 4, wherein said support means comprise a plurality of support pins, each of said support pins including a respective vertical support portion and a respective horizontal support portion.

6. A substrate heat-treating apparatus as defined in claim 5, wherein said support pins extend through said heat-treating plate.

7. A substrate heat-treating apparatus as defined in claim 1, wherein said support means comprise a plurality of support pins, each of said support pins including a respective one of said vertical support portions and a respective one of said horizontal support portions.

8. A substrate heat-treating apparatus for heat-treating substantially circular semiconductor wafers, comprising:
   a heat-treating plate for heat-treating a semiconductor wafer placed thereon;
   a plurality of support pins extending through said heat-treating plate for supporting said semiconductor wafer placed on said heat-treating plate;
   lift means for raising and lowering said support pins relative to said heat-treating plate;
   said plurality of support pins supporting said semiconductor wafer such that at least part of edges of said semiconductor wafer are at a higher level than a central region of said semiconductor wafer as said semiconductor wafer is raised and lowered by said lift means, said support pins including support portions for supporting, from below, said semiconductor wafer in peripheral positions adjacent said edges thereof, and position restricting portions for restricting a horizontal position of said semiconductor wafer by contacting said edges of said semiconductor wafer; and
   wherein said position restricting portions of said plurality of support pins remain projecting upward from an upper surface of said heat-treating plate, when said support pins are lowered to a heating position.

9. A substrate heat-treating apparatus as defined in claim 8, wherein said heat-treating plate includes balls embedded with upper ends thereof slightly protruding from the surface of said heat-treating plate, said semiconductor wafer being placed on said balls.

* * * * *